(12) United States Patent
Cañones Bonham

(10) Patent No.: US 11,312,316 B2
(45) Date of Patent: Apr. 26, 2022

(54) EMBLEM FOR VEHICLES

(71) Applicant: Zanini Auto Grup, S.A., Barcelona (ES)

(72) Inventor: David Cañones Bonham, Barcelona (ES)

(73) Assignee: Zanini Auto Grup, S.A., Barcelona (ES)

( * ) Notice: Subject to any disclaimer, the term of this patent is extended or adjusted under 35 U.S.C. 154(b) by 0 days.

(21) Appl. No.: 16/897,907

(22) Filed: Jun. 10, 2020

(65) Prior Publication Data
US 2021/0387580 A1 Dec. 16, 2021

(51) Int. Cl.
| | | |
|---|---|---|
| B60R 13/00 | (2006.01) | |
| B60Q 1/24 | (2006.01) | |
| F21V 21/096 | (2006.01) | |
| H02K 1/12 | (2006.01) | |
| H02K 1/27 | (2022.01) | |
| H05K 1/18 | (2006.01) | |
| H05K 5/03 | (2006.01) | |
| H05K 7/14 | (2006.01) | |

(52) U.S. Cl.
CPC .............. *B60R 13/005* (2013.01); *B60Q 1/24* (2013.01); *F21V 21/096* (2013.01); *H02K 1/12* (2013.01); *H02K 1/27* (2013.01); *H05K 1/181* (2013.01); *H05K 5/03* (2013.01); *H05K 7/1427* (2013.01); *H05K 2201/10083* (2013.01); *H05K 2201/10106* (2013.01)

(58) Field of Classification Search
CPC ....... B60R 13/005; B60Q 1/24; F21V 21/096; H02K 1/12; H02K 1/27; H05K 1/181; H05K 5/03; H05K 7/1427
See application file for complete search history.

(56) References Cited

U.S. PATENT DOCUMENTS

| | | | |
|---|---|---|---|
| 7,168,831 B2 | 1/2007 | Cho | |
| 10,442,242 B2 | 10/2019 | Bai | |
| 2004/0257825 A1* | 12/2004 | Choi | B60Q 1/326 |
| | | | 362/500 |
| 2005/0099820 A1* | 5/2005 | Cooper | B60Q 1/326 |
| | | | 362/500 |
| 2005/0195612 A1* | 9/2005 | Cho | B60R 13/005 |
| | | | 362/500 |
| 2006/0209536 A1* | 9/2006 | Bartels | B60Q 1/326 |
| | | | 362/192 |
| 2009/0015057 A1* | 1/2009 | Groomes | B60Q 1/326 |
| | | | 301/37.108 |
| 2014/0267458 A1* | 9/2014 | Fisher | B60B 7/0033 |
| | | | 345/690 |
| 2015/0170558 A1* | 6/2015 | Salah | B60B 7/04 |
| | | | 301/5.22 |
| 2018/0022149 A1* | 1/2018 | Bai | B60B 7/006 |
| | | | 301/37.25 |

* cited by examiner

*Primary Examiner* — Bryon T Gyllstrom
*Assistant Examiner* — Christopher E Dunay

(57) ABSTRACT

Emblem for vehicles, comprising a decoration layer; at least one lighting element that illuminates the decoration layer; an electrical power generator that feeds electric power to the at least one lighting element, wherein the electrical power generator includes a rotor comprising a support disc for at least one magnet; and a stator comprising at least one printed circuit board provided with windings. It permits to provide an emblem in which a power generator is optimized to be compatible in the axial direction with the available space, which is very small behind the front cover.

13 Claims, 3 Drawing Sheets

EMBLEM FOR VEHICLES

The present invention refers to an emblem for vehicles, in particular to an emblem that is used in a fixed orientation on hubs of vehicle wheels.

BACKGROUND OF THE INVENTION

There is an increasing trend to improve the external appearance of vehicles by adding luminous effects. Additionally, the car manufacturers and the rim manufacturers want to maintain the visibility of their representative emblems in all possible external lighting situations. One possible location to combine both targets is the hub of the automobile wheel by illuminating a figure that remains in stationary condition.

There is a variety of devices generating electrical energy based on the use of the torque of a wheel. The combination of permanent magnets and coils allows to power the LEDs on a printed circuit board, illuminating an advertisement member.

This solution has constraints in terms of technical feasibility because of available space and in terms of financial feasibility because of the involved investments and small manufacturing volumes usually associated.

Some available solutions are described below:

U.S. Pat. No. 7,168,831 B2 discloses a power generation unit and a magnetic core fitted on a fastening shaft that rotates with the wheel. This requires a power supply terminal and an electric line to connect them to the printed circuit board that contains the LEDs. The power generation unit (or coil) requires a significant investment and the total solution requires a significant space in the axial direction.

U.S. Ser. No. 10/442,242 B2 discloses an electrical energy generating system. It contains magnets on the surface of the member that rotates with the wheel. The printed circuit board, that is electrically connected to the stator (coil) and to the LEDs, is assembled to a bearing to avoid it rotates with the rotating shaft. The coil of the stator requires a significant investment, difficult to be financially justified if the number of devices to be manufactured is low.

DESCRIPTION OF THE INVENTION

Therefore, one purpose of the present invention is to provide an emblem in which a power generator is optimized to be compatible in the axial direction with the available space, which is very small behind the front cover.

With the emblem for vehicles according to the present invention it is possible to solve said drawbacks, providing other advantages that are described below.

The emblem for vehicles according to the present invention comprises:
- a decoration layer;
- at least one lighting element that illuminates the decoration layer;
- an electrical power generator that feeds electric power to the at least one lighting element, wherein the electrical power generator includes:
- a rotor comprising a support disc for at least one magnet; and
- a stator comprising at least one printed circuit board provided with windings.

According to a preferred embodiment, the windings of the printed circuit board or of each printed circuit board are connected in series.

Preferably, for maintaining a fixed position, the emblem for vehicles according to the present invention also comprises an eccentric weight.

Advantageously, a spacer is placed between the support disc and the or each printed circuit board, which ensures a controlled distance between the support disc and the printed circuit board in the axial direction.

According to a preferred embodiment, the stator comprises two printed circuit boards, the windings of each printed circuit board are connected to each other by pins.

Furthermore, said at least one printed circuit board comprises magnetic conducting layer and a light guide, wherein the light guide is mounted on the magnetic conducting layer.

Preferably, the at least one lighting element is mounted on the at least one printed circuit board.

According to a preferred embodiment, the support disc comprises magnets at both sides.

Furthermore, the emblem for vehicles according to the present invention comprises a housing formed by a base and a cover.

In an emblem for vehicles, the available space is very small, and in the emblem according to the present invention the dimensions are optimized to be compatible in the axial direction with the available space.

BRIEF DESCRIPTION OF THE DRAWINGS

For a better understanding the above explanation and for the sole purpose of providing an example, some non-limiting drawings are included that schematically depict a practical embodiment.

DESCRIPTION OF A PREFERRED EMBODIMENT

Figure 1:
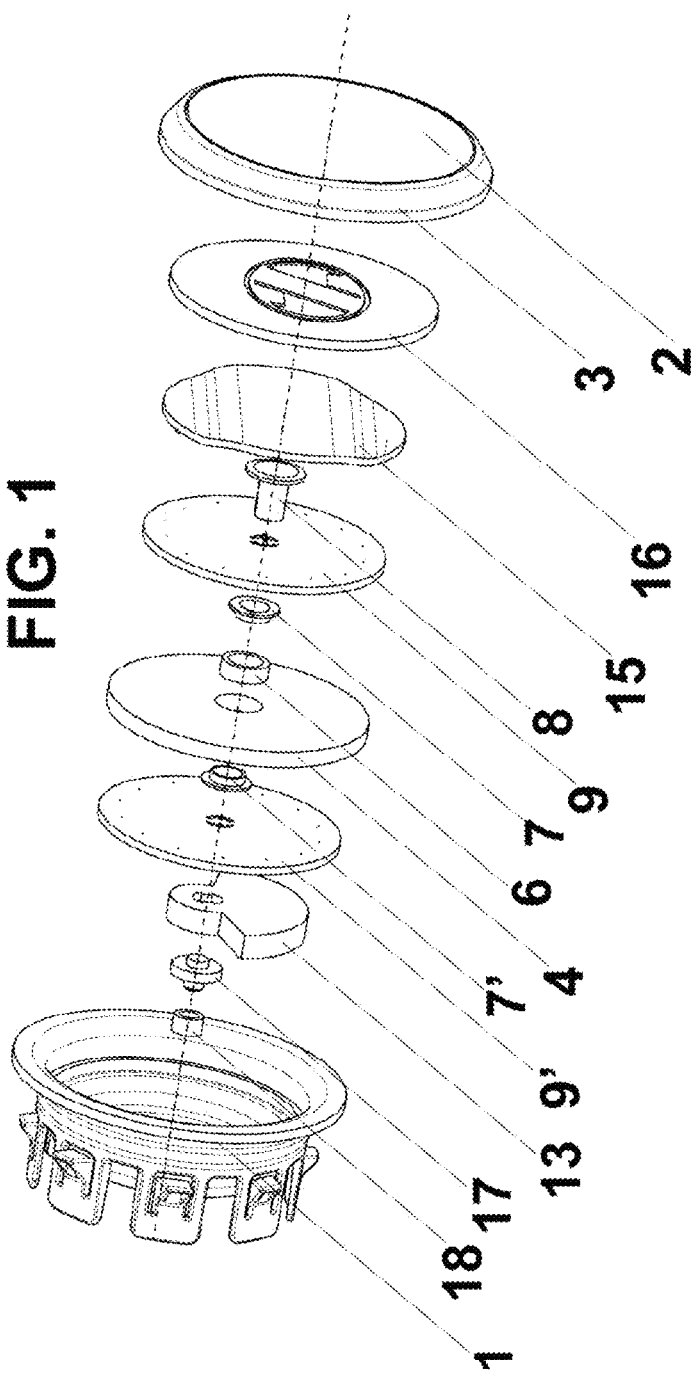
FIG. 1 is an exploded view showing the main parts of the emblem for vehicles according to the present invention.
Figure 2:
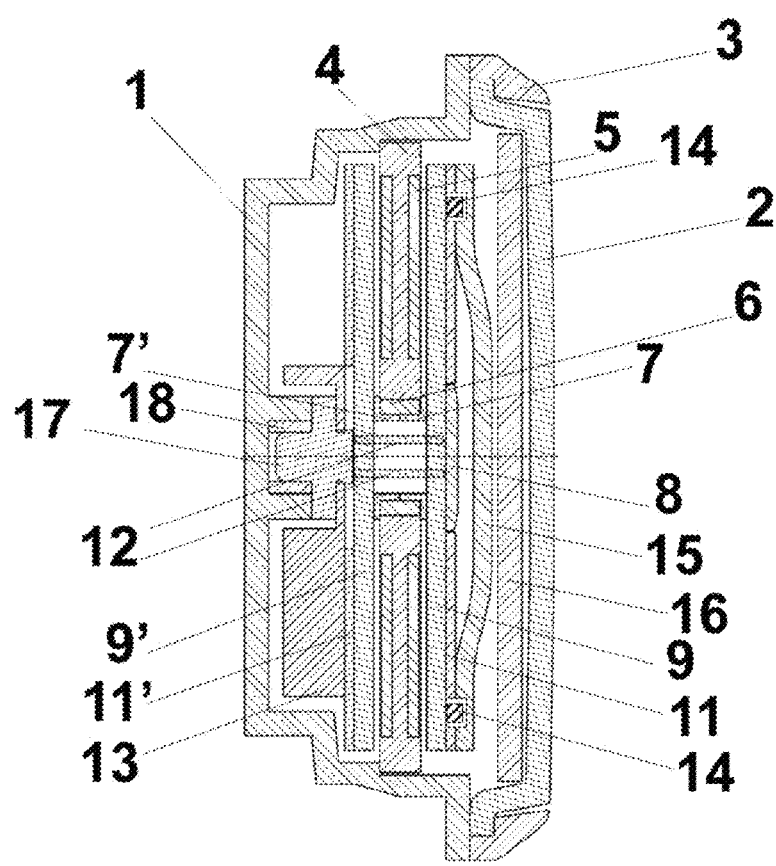
FIG. 2 is a detailed cross section of the assembled emblem shown on FIG. 1.

Referring to FIG. 1 and FIG. 2, they show the emblem for vehicles according to the present invention.

A tightly sealed housing is formed by a base 1, a cover 2 with a decoration ring 3. This housing is fixed to a hub of an automobile wheel. The cover 2 may offer total or partial transparency on its front side. The housing provides protection against water, dust or other contamination to the internal device which generates electrical energy used to illuminate the front side.

A support disc 4 with permanent magnets 5 is fixed on its perimeter to the housing to perform the function of rotor of the electrical power generator when the wheel is rotating. The permanent magnets 5 may be with or without alternating polarity. The support disc 4 holds a bearing 6 in its axis that allows free rotation of a spacer 7 and a shaft 8.

The shaft 8 holds a printed circuit board 9 located between the support disc 4 and the cover 2.

The spacer 7 ensures a controlled distance between the support disc 4 and the printed circuit board 9 in the axial direction.

Figure 3:
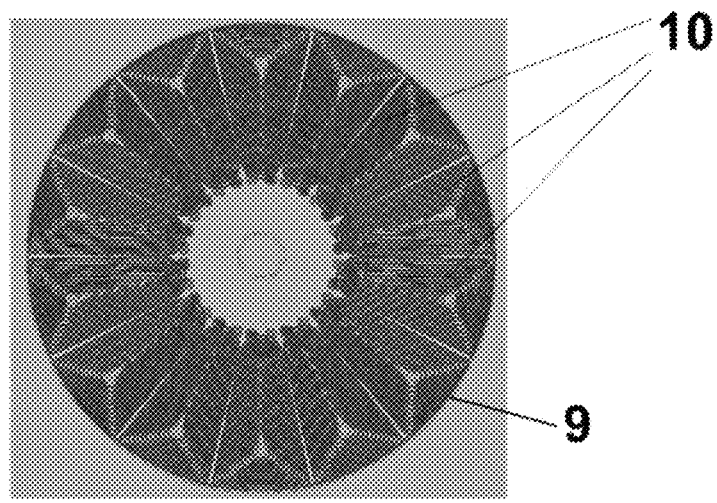
FIG. 3 is a layer of a printed circuit board showing traces forming windings, used in the emblem for vehicles according to the present invention.

The printed circuit board 9 contains one or more layers with sets of windings 10 shown in FIG. 3. The different layers of the printed circuit board 9 are connected through vias. The layout of the windings 10 may be of conventional design, maintaining the wire trace following the same direction of rotation between layers.

All windings 10 are connected in series, providing a single output phase. This part of the printed circuit board 9 acts as the stator of the electrical power generator.

The transformation of the generated magnetic field into electrical power may be improved by adding a magnetic conductor layer 11 located on the face of the printed circuit board 9, which is more distant from the permanent magnets 5, confining the magnetic field.

The generated electrical power may be increased by adding a second printed board 9' hold by the shaft 8 and located close to the face of the support disc 4 which is more distant from the cover 2.

A spacer 7' ensures a controlled distance between the support disc 4 and the printed circuit board 9' in the axial direction. The windings of the printed circuit board 9' have a similar or the same design than the ones of the printed circuit board 9 and are series connected to them through pins 12 located in the inner part of the shaft 8.

Again, the transformation of the generated magnetic field into electrical power may be improved by adding a magnetic conductor layer 11' located on the face of the printed circuit board 9' which is more distant from the permanent magnets 5, confining the magnetic field.

The stationary assembly including the spacer 7 (and 7'), the shaft 8 and the printed circuit boards 9 (and 9') also contains a weight 13 eccentrically disposed.

The gravity force acting on the weight 13 maintains this assembly in a relative constant position despite of the rotating movement of the wheel and, consequently, of the external housing and internal rotor.

The printed circuit board 9, which is located between the support disc 4 and the front cover 2, is also electrically connected to lighting elements 14, such as LEDs, providing them the generated electrical power.

The lighting elements 14 illuminate a light guide 15 located between the printed circuit board 9 and a decoration layer 16. The light guide 15 distributes the light, irradiating it through the decoration layer 16.

The decoration layer 16 may combine opaque and transparent/translucent areas to define a figure (for instance, a manufacturer's emblem) that is desired to highlight with the illumination.

The light guide 15 and the decoration layer 16 may be two different parts, included on the stationary assembly, fixing them by glue, mechanical interference or soldering. Alternatively, they can be an integrated part, where the decoration layer 16 is just a film on the light guide 15, both included on the stationary assembly. In any case, the decoration layer 16 will also take advantage of the action of the weight 13, remaining at a stationary position, and making the figure more recognizable by an external observer.

The number of layers of windings 10 to be used on the printed circuit board 9 (and 9') will depend on:
 The luminosity specified by the customer (a range between a minimum and a maximum).
 The specified minimum speed of the vehicle that should be able to deliver the minimum specified luminosity.

Figure 4:
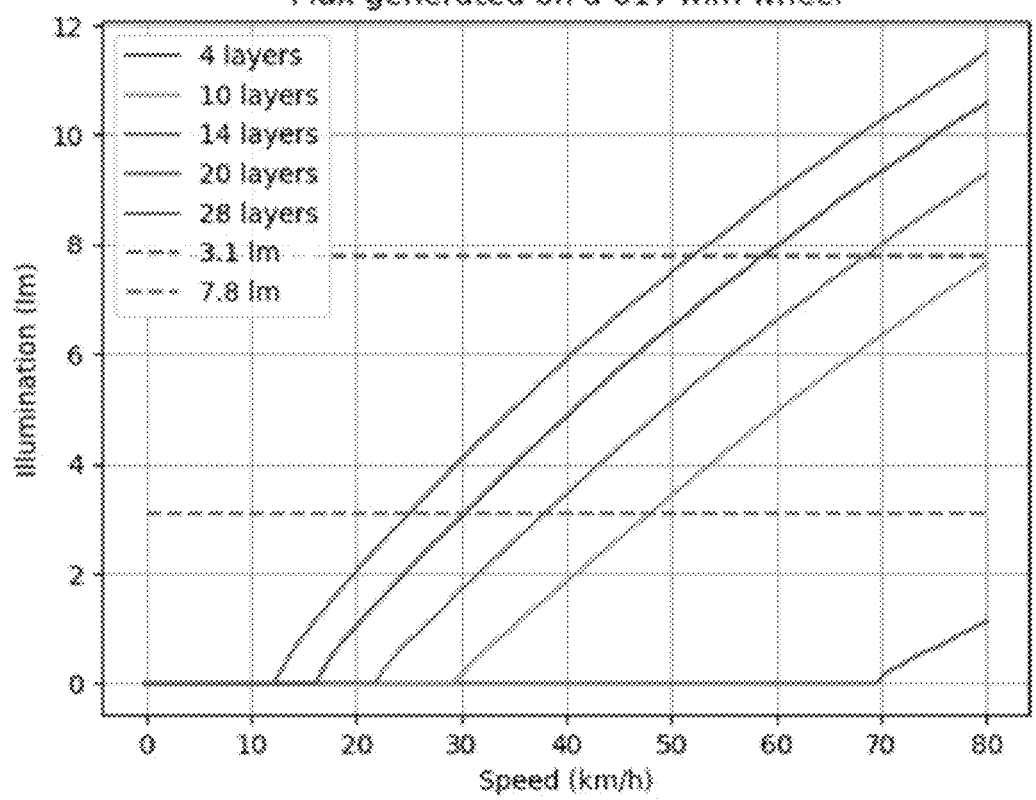
FIG. 4 is a simulation of the illumination power depending on the number of layers of a printed circuit board of the emblem according to the present invention and the vehicle speed.

FIG. 4 shows a graph with the simulation of the illumination power for different number of layers and the vehicle speed. As expected, it may be seen that a larger number of layers allow to achieve the minimum required illumination at a lower speed.

The printed circuit board 9 connected to the lighting elements 14 may include protection devices to limit the power delivered to the lighting elements 14 when the maximum specified luminosity is achieved, protecting them. These protection devices may take the form of low-pass filters, acting at a vehicle's speed above a specified value. This excess power may charge an energy storage device (a battery or supercapacitor) connected to the printed circuit board.

The energy available in the energy storage device may feed the lighting elements 14 in periods of time when the vehicle speed is slower than the required to achieve the minimum illumination level specified. If the energy storage device has a significant weight, it will be advisable to locate it eccentrically in the way to help the weight 13 to maintain the assembly at a stationary position thanks to gravity force.

The front cover may include protective layers (ultraviolet, impact resistance, antireflective) as generally adopted on standard non illuminated wheel hub emblems.

In order to reduce vibrations and increase mechanical robustness, a back shaft 17 may be included in the stationary assembly, radially positioned respect the base 1 by means of a bearing 18.

Even though reference has been made to a specific embodiment of the invention, it is obvious for a person skilled in the art that the emblem for vehicles described herein is susceptible to numerous variations and modifications, and that all of the details mentioned can be substituted for other technically equivalent ones without departing from the scope of protection defined by the attached claims.

The invention claimed is:

1. An emblem for vehicles, comprising:
 a decoration layer;
 at least one lighting element that illuminates the decoration layer;
 an electrical power generator that generates and feeds electric power to the at least one lighting element,
 wherein the electrical power generator includes:
 a rotor comprising a support disc, the support disc having at least one magnet thereon; and
 a stator comprising at least one printed circuit board, the at least one printed circuit board having windings as a part of traces that generate the electric power when the support disc rotates,
 wherein said at least one printed circuit board comprises a first printed circuit board having a first surface and a second surface, the first surface facing the support disc, the second surface being opposite to the first surface, the emblem further comprising a magnetic conducting layer disposed on the second surface of the first printed circuit board and configured to improve transformation of magnetic field into electric power.

2. The emblem for vehicles according to claim 1, wherein the windings of the printed circuit board or of each printed circuit board are connected in series.

3. The emblem for vehicles according to claim 1, wherein the emblem also comprises an eccentric weight.

4. The emblem for vehicles according to claim 1, wherein a spacer is placed between the support disc and the, or each, printed circuit board.

5. The emblem for vehicles according to claim 1, wherein the stator comprises two printed circuit boards, the windings of each printed circuit board are connected to each other by pins.

6. The emblem for vehicles according to claim 1, wherein the at least one lighting element is mounted on the at least one printed circuit board.

7. The emblem for vehicles according to claim 1, wherein the emblem also comprises a light guide.

8. The emblem for vehicles according to claim 7, wherein the light guide is mounted on the magnetic conducting layer.

9. The emblem for vehicles according to claim 1, wherein the support disc comprises magnets at both sides.

10. The emblem for vehicles according to claim 1, wherein the emblem comprises a housing formed by a base and a cover.

11. The emblem for vehicles according to claim 10, wherein the at least one printed circuit board of the stator further comprises a second printed circuit board, the second printed circuit board having a first surface facing the support disc and a second surface opposite to the first surface of the second printed circuit board, the second printed circuit board being disposed farther from the cover than the first printed circuit board in a rotational axis of the rotor.

12. The emblem for vehicles according to claim 1, wherein a stationary assembly comprises the decoration layer and the stator.

13. The emblem for vehicles according to claim 11, further comprising:
   a second magnetic conducting layer disposed on the second surface of the second printed circuit board.

\* \* \* \* \*